(12) United States Patent
Bose et al.

(10) Patent No.: US 9,373,415 B2
(45) Date of Patent: Jun. 21, 2016

(54) DYNAMIC HARD ERROR DETECTION

(71) Applicant: International Business Machines Corporation, Armonk, NY (US)

(72) Inventors: Pradip Bose, Yorktown Heights, NY (US); Alan Gara, Mount Kisco, NY (US); Hans M. Jacobson, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 29 days.

(21) Appl. No.: 13/969,337

(22) Filed: Aug. 16, 2013

(65) Prior Publication Data

US 2014/0229784 A1    Aug. 14, 2014

Related U.S. Application Data

(63) Continuation of application No. 13/765,320, filed on Feb. 12, 2013.

(51) Int. Cl.

| | |
|---|---|
| *G01R 31/28* | (2006.01) |
| *G06F 11/00* | (2006.01) |
| *G11C 29/08* | (2006.01) |
| *G01R 31/3185* | (2006.01) |
| *G01R 31/30* | (2006.01) |
| *G11C 29/06* | (2006.01) |
| *G01R 31/317* | (2006.01) |
| *G11C 29/04* | (2006.01) |

(52) U.S. Cl.
CPC ............... *G11C 29/08* (2013.01); *G01R 31/30* (2013.01); *G01R 31/318525* (2013.01); *G11C 29/06* (2013.01); *G01R 31/3171* (2013.01); *G11C 2029/0409* (2013.01)

(58) Field of Classification Search
CPC ............... G01R 31/318536; G01R 31/318552; G01R 31/318544; G01R 31/3187; G01R 31/318555; G01R 31/2855; G06F 11/2236; G06F 11/27
See application file for complete search history.

(56) References Cited

U.S. PATENT DOCUMENTS

| | | | |
|---|---|---|---|
| 4,831,623 A | 5/1989 | Terzian | |
| 5,511,164 A | 4/1996 | Brunmeier et al. | |
| 6,032,268 A | 2/2000 | Swoboda et al. | |
| 6,189,112 B1 | 2/2001 | Slegel et al. | |
| 6,249,890 B1 | 6/2001 | Ukani et al. | |
| 6,959,407 B2* | 10/2005 | Six | 714/726 |
| 7,269,780 B2* | 9/2007 | Arima et al. | 714/764 |
| 7,308,621 B2 | 12/2007 | Adams et al. | |
| 7,444,568 B2* | 10/2008 | Morrison et al. | 714/726 |
| 7,493,541 B1* | 2/2009 | Agrawal et al. | 714/733 |
| 7,966,536 B2* | 6/2011 | Ludewig et al. | 714/729 |
| 2006/0064265 A1* | 3/2006 | Kiryu | 702/117 |

(Continued)

OTHER PUBLICATIONS

Javier Carretoro et al., "End-to-End Register Data-Flow Continuous Self-Test", ISCA •09M Jun. 20-24, 2009, Austin, Texas, USA; pp. 11.
Siva Kumar Sastry Hari, •"Low-Cost Hardware Fault Detection and Diagnosis for Multicore Systems Running Multithreaded Workloads", Master of Science in Computer Science Thesis, University of Illinois at Urbana-Champaign, 2009; pp. 59.

(Continued)

*Primary Examiner* — Guerrier Merant
(74) *Attorney, Agent, or Firm* — Cantor Colburn LLP

(57) ABSTRACT

A method of testing a circuit includes halting a flow of normal data through the circuit, running test data through the circuit while subjecting the circuit to a stress condition, and determining whether a hard error exists in the circuit based on the running of the test data.

7 Claims, 4 Drawing Sheets

(56) References Cited

U.S. PATENT DOCUMENTS

| | | | |
|---|---|---|---|
| 2007/0050693 A1* | 3/2007 | Kiryu | 714/733 |
| 2007/0094569 A1 | 4/2007 | Thayer et al. | |
| 2008/0100328 A1* | 5/2008 | Dhong et al. | 324/765 |
| 2009/0138772 A1 | 5/2009 | Bertacco et al. | |
| 2009/0240977 A1 | 9/2009 | Prasky et al. | |
| 2009/0327824 A1* | 12/2009 | Alaniz et al. | 714/732 |
| 2010/0153801 A1 | 6/2010 | Urabe et al. | |
| 2010/0218035 A1 | 8/2010 | Avizienis | |
| 2011/0239070 A1 | 9/2011 | Morrison | |
| 2012/0226942 A1* | 9/2012 | Gangasani et al. | 714/30 |
| 2014/0157065 A1 | 6/2014 | Ong | |

OTHER PUBLICATIONS

Jaume Abella et al., "On-Line Failure Detection and Confinement in Caches", Proceedings of the 13th IEEE Inernational On-Line Testing Symposium, 2008; pp. 7.

Hyunjin Lee et al., "Perfectory: A Fault-Tolerant Directory memory Architecture", IEEE Transactions on Computers, vol. 59 No. 5 May 2010; pp. 13.

Omer Khan, A Hardware/Software Co-Design Architecture for Thermal, Power, and Reliability Management in Chip Multiprocessors, University of Massachusetts—Amherst, ScholarWorks@UMass Amherst; Feb. 2010; pp. 158.

* cited by examiner

DYNAMIC HARD ERROR DETECTION

CROSS-REFERENCE TO RELATED APPLICATION

This application is a continuation of U.S. patent application Ser. No. 13/765,320, filed Feb. 12, 2013, the disclosure of which is incorporated by reference herein in its entirety.

BACKGROUND

Physical structures on computer chips degrade with age. Electromigration, thermal stress and other conditions that increase or self-perpetuate over time may result in hard errors in logic, latches, registers or arrays on the chip, such as stuck-at faults or delays. In conventional chips, detecting hard errors is costly, because it requires either detection logic added to the chip, requiring chip area and power, or it consumes resources resulting in degraded performance or energy-consumption of the chip.

In addition, when a chip is manufactured, the chip may be tested to determine acceptable ranges of operation, then a margin may be added to one acceptable operating level and the chip may be programmed or designed to operate outside the margin to account for anticipated degradation of chip performance during the life of a chip. For example, a chip may be designed to operate below its optimal frequency based on estimates that over time the optimal frequency will drift downward.

SUMMARY

Embodiments include an apparatus for detecting hard errors in a circuit. The apparatus may include storage and a processing circuit. The storage has stored therein test data and normal data. The processing circuit includes combinational logic in series with at least one set of input latches and at least one set of output latches. The apparatus includes a test control module configured to control the processing circuit to halt a flow of normal data through the processing circuit and run the test data through the processing circuit while subjecting the processing circuit to a stress condition.

Additional embodiments include a computer program product for testing a circuit. The computer program product includes a tangible computer-readable storage medium having stored thereon a computer program for performing a method. The method includes halting a flow of normal data through the circuit, running test data through the circuit while subjecting the circuit to a stress condition, and determining whether a hard error exists in the circuit based on the running of the test data.

Further embodiments include a method including halting a flow of normal data through a circuit, running test data through the circuit while subjecting the circuit to a stress condition, and determining whether a hard error exists in the circuit based on the running of the test data.

Additional features and advantages are realized by implementation of embodiments of the present disclosure. Other embodiments and aspects of the present disclosure are described in detail herein and are considered a part of the claimed invention. For a better understanding of the embodiments, including advantages and other features, refer to the description and to the drawings.

BRIEF DESCRIPTION OF THE SEVERAL VIEWS OF THE DRAWINGS

The subject matter which is regarded embodiments of the present disclosure is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

The performance of conventional chips or circuits may degrade over time resulting in hard errors, such as stuck-at or delay errors in the circuitry. Embodiments of the disclosure relate to providing in-line testing of a chip or circuit over the life of the chip or circuit.

Figure 1:
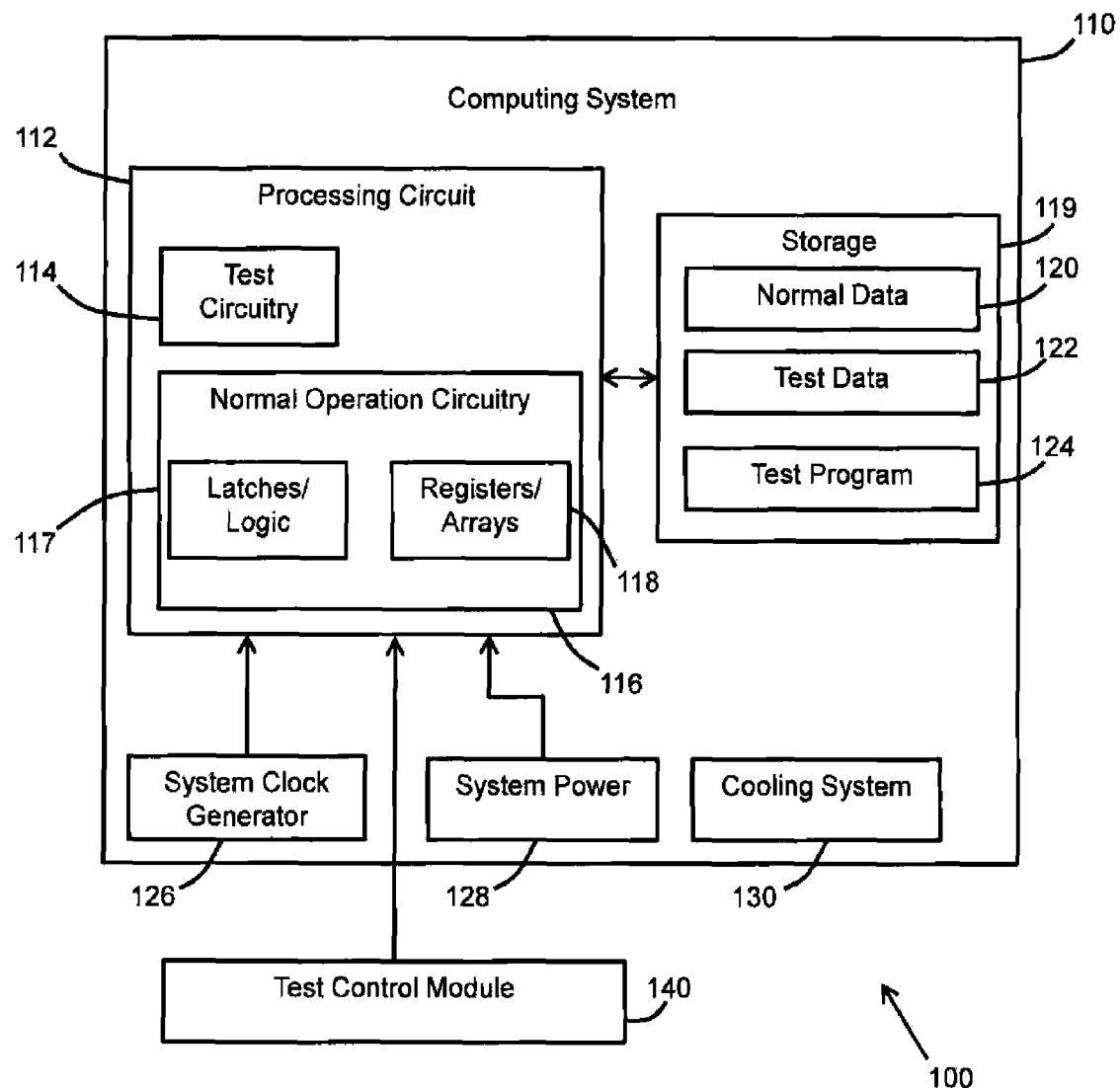
FIG. 1 illustrates a system for testing a circuit according to an embodiment of the disclosure.

FIG. 1 illustrates a system 100 according to an embodiment of the disclosure. The system 100 includes a computing system 110 and may include an external test control module 140. The computing system 110 may be a computer, including a processing circuit 112 and storage 119 within one housing or outer frame, or the computing system 110 may be distributed among multiple housings and structures. The test control module 140 may include a device or computer or may include a computer program executed by one or more computers or systems to control testing of the computing system 110.

The computing system 110 may include the processing circuit 112, storage 119, system clock generator 126, system power module 128 and cooling system 130. The processing circuit 112 may include one or more processors having one or more processing cores, control and processing logic, and any other hardware for performing processing of data. The processing circuit 112 may include normal operation circuitry 116 and test circuitry 114. The normal operation circuitry 116 may include, for example, input and output latches in series with combinational logic circuitry 117, such that data is input into input latches, from the input latches to the combinational logic, and from the combinational logic to output latches. The normal operation circuitry 116 may also include registers and arrays 118 for data storage, and particularly for short-term storage of data as the data is being processed by the processing circuit 112. The normal operation circuitry 116 may be defined as circuitry that is used to process data during normal operation of the processing circuit 112. The test circuitry 114 may include logic and other circuitry for providing test data to the latches and other hardware of the normal operation circuitry.

Throughout the present specification and claims, "normal operation" may be defined as operation of the computing system 110 to perform the regular functions of the computing system 110 and not to perform test-specific operations on the hardware or software of the computing system 110 to test for hard errors. Similarly, an environment in which the processing circuit 112 operates normally is defined as an environment in which the processing circuit 112 performs normal and non-testing-specific functions of the computing system 110. Testing-specific functions are defined as functions in which normal data is replaced by testing data or normally-used circuitry is replaced with testing circuitry.

Storage may store normal data 120, test data 122 and a test program 124. In the present specification and claims, "normal data" is defined as data generated or used during normal operation of the computing system 110 and not during testing to test the functionality of the computing system. "Test data" 122 is defined as data that is provided to a circuit in the place of normal data to test the functionality of hardware or software of the computing system 110.

The test program 124 may be provided in addition to, or alternatively to, the test control module 140. In other words, in one embodiment, testing of the processing circuit 112 is controlled by an external device, such as the test control module 140, and in an alternative embodiment, testing of the processing circuit 112 is controlled by the test program 124 internal to the computing system 110. In yet another alternative embodiment, some portions of the testing of the processing circuit 112 may be performed by the test control module 140 and other portions may be performed by the test program 124. In yet another embodiment, the test circuitry 114 is capable of performing a build-in self-test independently of the test program 124 and the test control module 140. In other words, the processing circuit 112 may perform an entirely self-generated and self-contained built-in self-test.

In one embodiment, the processing circuit 112 is tested by a built-in self-test (BIST), such as the test program 124 or other BIST utilizing the test data 122. The BIST may be configured to test the integrity of the latches and logic 117, the registers and arrays 118 and any other hardware or software of the processing circuit 112. In embodiments of the present disclosure, one or both of the test control module 140 and the test program 124 may test the processing circuit 112 in predetermined environmental conditions. Examples of environmental conditions include performing the BIST at a predetermined frequency, voltage or temperature. In addition, a volume of data provided to the processing circuit 112 may be controlled.

In particular, in embodiments of the present disclosure one or both of the test control module 140 and the test program 124 may set the environmental conditions at levels to stress the processing circuit 112. The levels may correspond to conditions in which the processing circuit 112 operates under normal conditions, or more extreme conditions than the processing circuit operates under normal conditions.

In one embodiment, one of the test control module 140 and the test program 124 controls the system clock generator 126 to increase an operating frequency of the processing circuit 112 relative to a normal operating frequency. In another embodiment, one of the test control module 140 and the test program 124 controls the system power module 128 to increase or decrease a voltage of signals, such as data signals, provided to the processing circuit 112, or to increase or decrease a voltage supplied to run components of the processing circuit 112, such as latches and combinational logic.

In another embodiment, one of the test control module 140 and the test program 124 controls the processing circuit 112 to access an increased volume of data relative to normal operation of the processing circuit 112 that stresses the noise margin on the voltage supply of the circuit. Although a few examples of environmental conditions have been provided to illustrate stresses to a processing circuit 112, embodiments of the present disclosure encompass any environmental stresses that may be applied to a processing circuit 112 from a source within the computing system 110 or external to the computing system 110.

Figure 2:
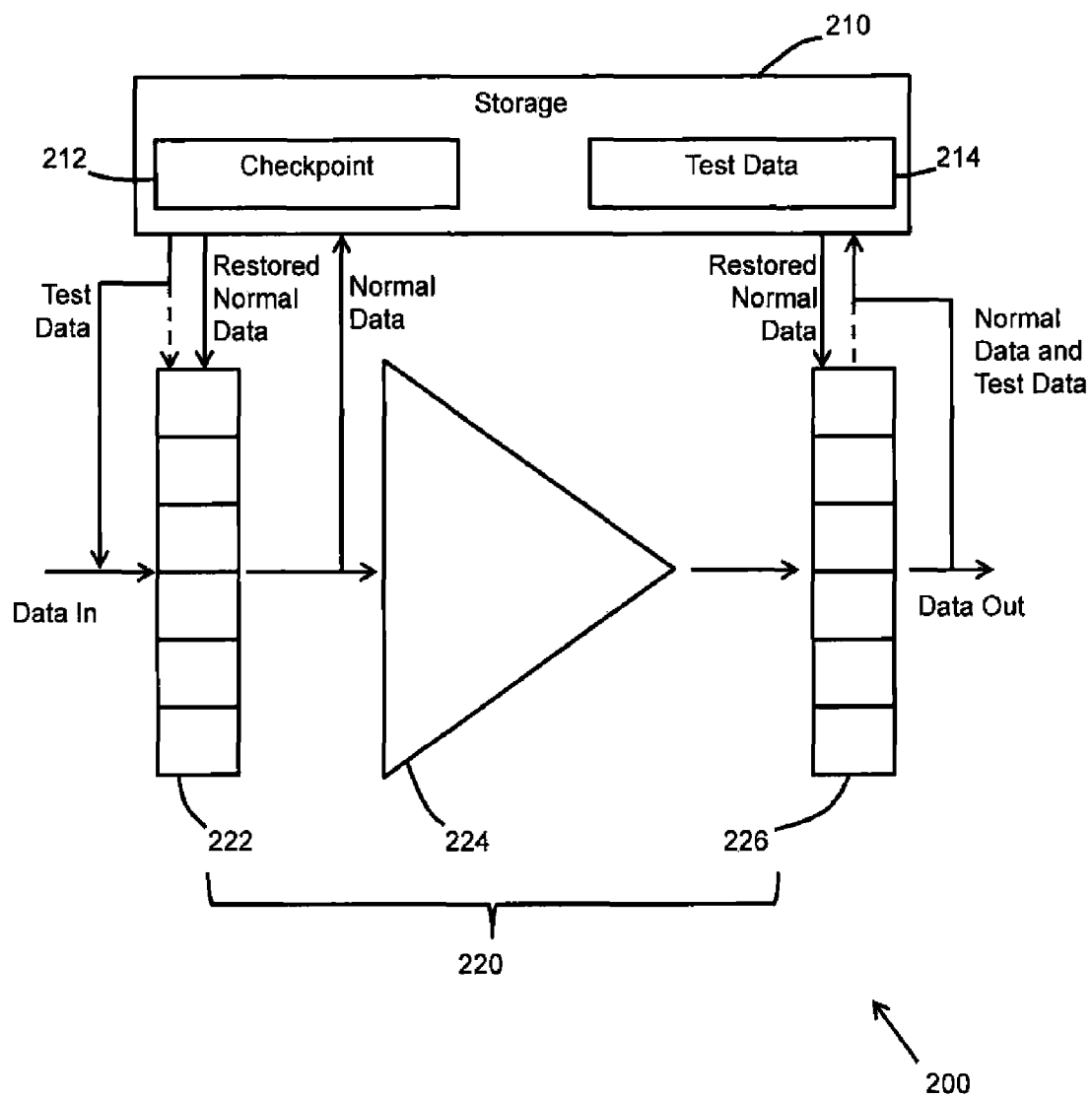
FIG. 2 illustrates a system for testing combinational logic according to one embodiment.

FIG. 2 illustrates an example of a system 200 for testing a logic circuit 220, such as the latches and logic 117 of FIG. 1. The system 200 includes the logic circuit 220 and storage 210 for storing checkpointed normal data in a checkpoint 212 and also for storing test data 214. The logic circuit 220 includes a set of input latches 222, combinational logic 224 and a set of output latches 226. The sets of input and output latches 222 and 226 may be of any size. In addition, while only one set of input latches 222, one combinational logic block 224 and one set of output latches 226 is illustrated in FIG. 2, the logic circuit 220 may typically include multiple combinational logic blocks arranged in series between latches. For example, the set of output latches 226 may act as a set of input latches for a next combinational logic block in series, and any number of combinational logic blocks may be connected in series bracketed by input and output latches.

During normal operation, data to be operated on by the combinational logic 224 is provided from an external source via input/output (I/O) connections, via a data bus, via storage (such as storage 119 of FIG. 1), or via any other source or combination of sources. The normal data is held in the set of input latches 222, and when latched, the set of input latches 222 outputs the normal data to the combinational logic 224. The combinational logic outputs the normal data having been subjected to logical functions to the output latches 226. Upon asserting the latch, the normal data is output to a next combinational logic block or to an output bus, storage, I/O connections, or any other output and new normal data is provided from the set of input latches 222 to the combinational logic 224.

Embodiments of the present disclosure include detecting hard errors in the set of input latches 222, the set of output latches 226 and the combinational logic 224. The hard errors may correspond to stuck states of the latches or logic or any other type of hard error. The hard errors are detected by testing the system 200 while subjecting the system to a predetermined stress condition, such as a temperature, frequency or voltage or by adjusting a volume of data provided to the system 200 per unit of time.

The system 200 may be tested by storing the data from the set of input latches 222 and the set of output latches 226 in the checkpoint 212 of storage to store the operational state of the logic circuit 220. In other words, the system 200 may operate normally for a predetermined period of time, and then the normal operation may be halted to perform the hard error test. The states of the sets of input and output latches 222 and 226 may be stored by reading the outputs from the latches to the combinational logic, by dedicated data lines from the latches to the storage 210 or by any other method.

Once the states of the sets of input and output latches 222 and 226 are stored in the checkpoint 212, test data 214 from the storage 210 may be provided to the set of input latches 222. Although FIG. 2 illustrates test data 214 provided from storage 210, embodiments of the disclosure encompass test data 214 provided from any source, such as internal or external devices to a system, computer or assembly of which the logic circuit 220 is a part. The test data 214 may be cycled through the set of input latches 222, modified by the combinational logic 224 and cycled through the set of output latches 226. The process may be repeated for any number of combinational logic blocks. Data output from the sets of input and output latches 222 and 226 may be provided to storage 210 and to a test analysis circuit (such as the test control module 140 or test program 124 of FIG. 1). The test data results may be analyzed to detect hard errors in the sets of latches 222 and 226 and the combinational logic 224.

In addition to reading data output from the sets of latches 222 and 226, data may be read out from the output of the combinational logic 224 to isolate errors in the combinational logic 224. For example, it may be determined that no error exists at the output of the set of input latches 222 but an error exists at the output of the combinational logic 224, and a hard error may accordingly be identified within the combinational logic 224. In addition, while FIG. 2 illustrates test data provided to the set of input latches 222, test data may be provided to any number of latches. For example, test data may be provided to both the set of input latches 222 and the set of output latches 226, or test data may be provided only to the set of input latches 222 and the test data may be cycled through the set of input latches 222 to the combinational logic 224 and the output latches 226. The output latches 226 may be latched to provide the test data to a next set of combinational logic and output latches, and so forth.

Once the test is complete, if the number of hard errors is below a predetermined threshold, the normal data may be restored to the sets of input and output latches 222 and 226, and the system 200 may continue to operate normally.

Figure 3:
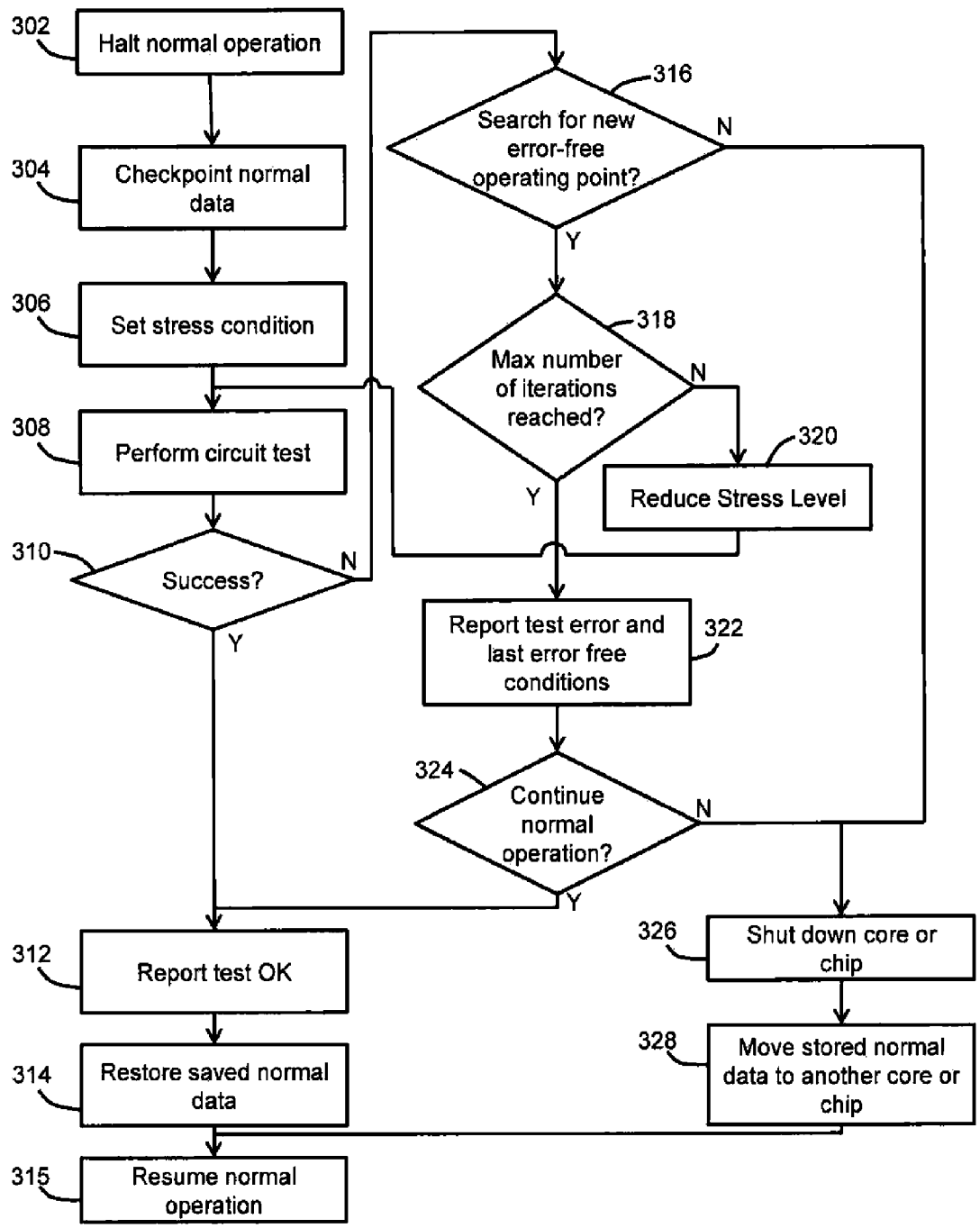
FIG. 3 illustrates a flowchart of a method for testing a circuit.

FIG. 3 illustrates a process according to an embodiment of the disclosure. In block 302, normal operation of a circuit is halted. "Normal operation" refers to processing data to perform the functions of the circuit, and does not include performing testing of the circuit for hard errors. In block 304, the normal data is stored in a checkpoint. In block 306, a stress condition is set. The stress condition may correspond to an actual or simulated environmental condition.

For example, if the circuit operates normally in an environment having a range of temperatures, the stress condition may correspond to the range of temperatures, or temperatures just outside the range of temperatures. Alternatively, if the circuit operates normally at a predetermined frequency, then the frequency of the circuit may be set at the predetermined frequency to test the circuit under its normal operating conditions, or the frequency of the circuit may be increased or decreased from the predetermined frequency to provide additional stress levels to the circuit. In yet another example, if the circuit operates at a predetermined operating voltage, then the voltage of the circuit during testing may be set at the predetermined operating voltage or may be increased or decreased to provide additional stress to the circuit. While a few examples have been provided, any type of stress condition, including any actual or simulated environmental condition, may be set to provide a predetermined stress to the circuit.

In block 308, a circuit test is performed. The circuit test may be, for example, a BIST of latches, logic, registers and/or arrays of a processing circuit to detect hard errors in the processing circuit. The circuit test may include replacing the normal data in the circuit, having been stored in the checkpoint, with test data and performing test operations, such as cycling latches and logic and performing read and write operations on registers and arrays.

In block 310 it is determined if the circuit test is successful. If the circuit test is successful, such as if the number of hard errors detected is less than a predetermined threshold, then the test outcome may be reported as "OK" in block 312. In addition, the normal data may be restored to the circuit in block 314 and normal operation of the circuit may be resumed in block 315. In embodiments of the present disclosure, the testing of a circuit may be performed in-line, or while the circuit is connected in its normal operating environment instead of only after the circuit is manufactured or is in a non-normal operating environment. In addition, when a circuit is tested outside of its normal operating environment, stress conditions may be set to simulate conditions in the normal operating environment. In addition, when the circuit is tested in the normal operating environment, additional stress conditions may be set to test operating characteristics of the circuit outside, or at the extremes, of normal operating conditions.

If, in block 310, it is determined that the test is not successful, in block 316 it may be determined whether the test should include a search for a new error-free operating point, where the operating point corresponds to conditions under which the circuit may operate. For example, if the circuit is tested in a first test condition corresponding to a first temperature, voltage or frequency, it may be determined in block 316 whether the test is set up to find another temperature, voltage or frequency at which the circuit may operate. The decision of block 316 may correspond to comparing the set stress condition with ideal operating conditions, with operating condition limits (such as a maximum or minimum possible operating temperature, voltage or frequency) or any other threshold stress condition.

If it is determined in block 316 that no further search for an error-free point should be performed, the core or chip including the circuit maybe shut down in block 326, the normal data from the checkpoint may be moved to another core or chip in block 328 and normal operation may proceed on the other core or chip based on the stored normal data from the tested circuit.

On the other hand, if it is determined in block 316 that a search should be made for a new error-free operating point, then it may be determined in block 318 if a maximum number of iterations of the test has been reached. If not, then in block 320 a stress level may be reduced 320, such as by adjusting a temperature, voltage or frequency of the tested circuit, and the test is repeated in block 308.

However, if it is determined in block 318 that the maximum number of iterations has been reached, then a test error may be reported in block 322 and the last error-free conditions may be reported. In block 324, it is determined whether the tested circuit should continue normal operation. For example, it may be determined whether a number of detected hard errors is less than a predetermined threshold, whether detected hard errors would adversely affect operation of the circuit or any other consideration. If it is determined that normal operation should continue, then the test may be reported as "OK" in block 312, the stored normal data may be restored in block 314, and normal operation may resume in the circuit in block 315.

On the other hand, if it is determined in block 324 that normal operation should not resume, the core or chip associated with the tested circuit may be shut down in block 326, the stored normal data of the tested circuit may be moved to another core or chip in block 328 and normal operation of the data may resume on the new core or chip in block 315.

FIG. 3 illustrates one example of a method for testing a circuit according to embodiments of the present disclosure. However, it is understood that embodiments of the disclosure encompass processes including additional operations or having operations omitted relative to FIG. 3. In other words, embodiments of the disclosure encompass any process for testing a circuit having previously been operating in a normal operating mode and applying stress conditions to the circuit during testing.

Embodiments may be implemented in any computer system, device, chip or circuit. For example, in one embodiment a logic circuit (such as the logic circuit 100 of FIG. 1) or the system for testing the logic circuit (such as the system 200 of FIG. 2) may be implemented in an active memory cube (AMC) device. An AMC may be a storage device that contains multiple layers of addressable memory elements. The memory may be divided into memory vaults, or three-dimensional blocked regions of the memory cube which share a common memory controller or processing element, and are capable of servicing memory access requests to their domain of memory independently of one another. In one embodiment, each separate memory controller or processing element may include a logic circuit or system for testing the logic circuit according to embodiments of the present disclosure. An active memory cube, or active buffered memory, is described in further detail in U.S. application Ser. No. 13/566, 019, the contents of which are hereby incorporated by reference in their entirety.

Figure 4:
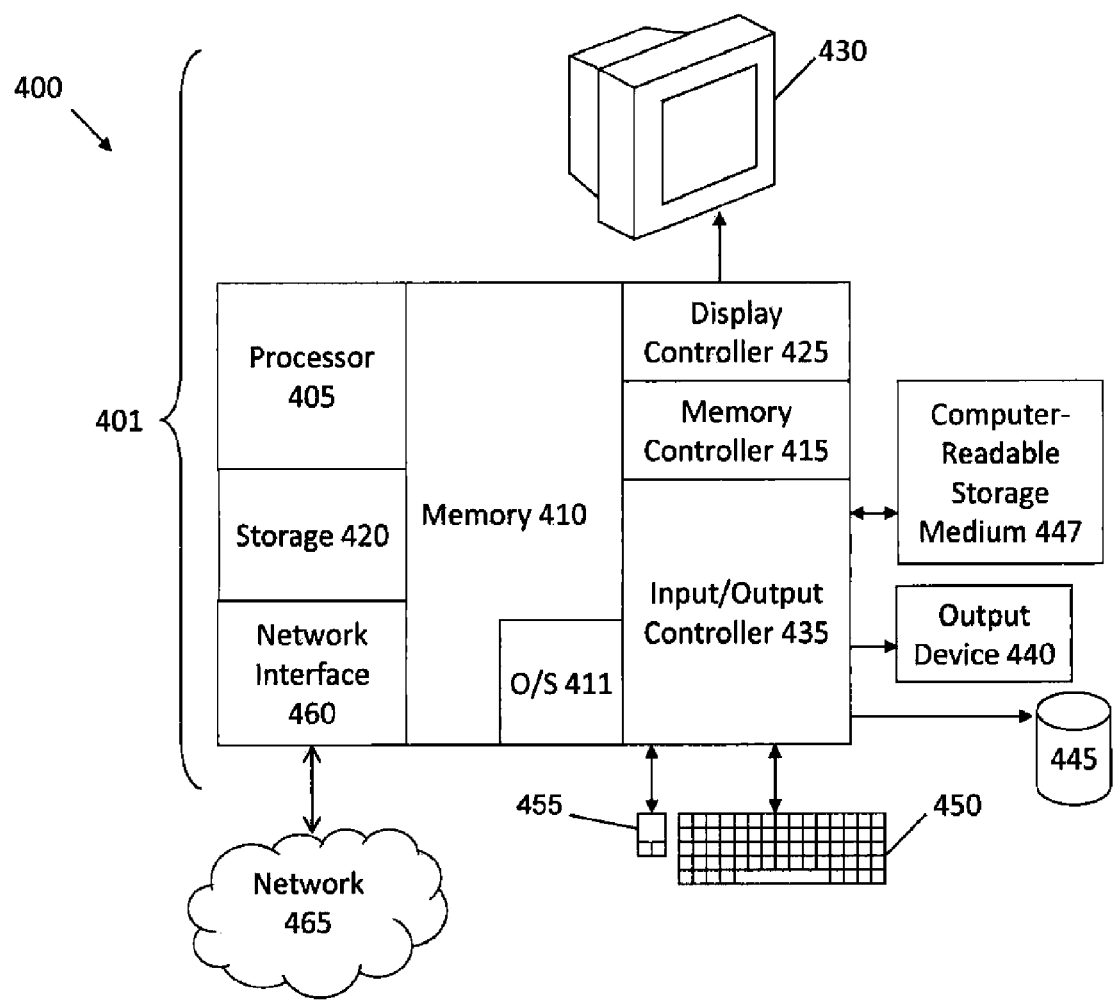
FIG. 4 illustrates a computer system according to one embodiment.

FIG. 4 illustrates a block diagram of a computer system 400 according to another embodiment of the present disclosure. The methods described herein can be implemented in hardware, software (e.g., firmware), or a combination thereof. In one embodiment, the methods described herein are implemented in hardware as part of the microprocessor of a special or general-purpose digital computer, such as a personal computer, workstation, minicomputer, or mainframe computer. The system 400 therefore may include general-purpose computer or mainframe 401 capable testing a reliability of a base program by gradually increasing a workload of the base program over time.

In one embodiment, in terms of hardware architecture, as shown in FIG. 4, the computer 401 includes a one or more processors 405, memory 410 coupled to a memory controller 415, and one or more input and/or output (I/O) devices 440, 445 (or peripherals) that are communicatively coupled via a local input/output controller 435. The input/output controller 435 can be, for example, one or more buses or other wired or wireless connections, as is known in the art. The input/output controller 435 may have additional elements, which are omitted for simplicity in description, such as controllers, buffers (caches), drivers, repeaters, and receivers, to enable communications. Further, the local interface may include address, control, and/or data connections to enable appropriate communications among the aforementioned components. The input/output controller 435 may include a plurality of sub-channels configured to access the output devices 440 and 445. The sub-channels may include, for example, fiber-optic communications ports. The input/output controller 435 may also transmit and receive data to/from an external computer-readable storage medium 447.

The processor 405 is a hardware device for executing software, particularly that stored in storage 420, such as cache storage, or memory 410. The processor 405 can be any custom made or commercially available processor, a central processing unit (CPU), an auxiliary processor among several processors associated with the computer 401, a semiconductor based microprocessor (in the form of a microchip or chip set), a macroprocessor, or generally any device for executing instructions.

The memory 410 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 410 may incorporate electronic, magnetic, optical, and/or other types of storage media. Note that the memory 410 can have a distributed architecture, where various components are situated remote from one another, but can be accessed by the processor 405.

The instructions in memory 410 may include one or more separate programs, each of which comprises an ordered listing of executable instructions for implementing logical functions. In the example of FIG. 4, the instructions in the memory 410 include a suitable operating system (O/S) 411. The operating system 411 essentially controls the execution of other computer programs and provides scheduling, input-output control, file and data management, memory management, and communication control and related services.

In one embodiment, a conventional keyboard 450 and mouse 455 can be coupled to the input/output controller 435. Other output devices such as the I/O devices 440, 445 may include input devices, for example but not limited to a printer, a scanner, microphone, and the like. Finally, the I/O devices 440, 445 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 400 can further include a display controller 425 coupled to a display 430. In an exemplary embodiment, the system 400 can further include a network interface 460 for coupling to a network 465. The network 465 can be an IP-based network for communication between the computer 401 and any external server, client and the like via a broadband connection. The network 465 transmits and receives data between the computer 401 and external systems. In an exemplary embodiment, network 465 can be a managed IP network administered by a service provider. The network 465 may be implemented in a wireless fashion, e.g., using wireless protocols and technologies, such as WiFi, WiMax, etc. The network 465 can also be a packet-switched network such as a local area network, wide area network, metropolitan area network, Internet network, or other similar type of network environment. The network 465 may be a fixed wireless network, a wireless local area network (LAN), a wireless wide area network (WAN) a personal area network (PAN), a virtual private network (VPN), intranet or other suitable network system and includes equipment for receiving and transmitting signals.

When the computer 401 is in operation, the processor 405 is configured to execute instructions stored within the memory 410, to communicate data to and from the memory 410, and to generally control operations of the computer 401 pursuant to the instructions.

In one embodiment, the methods of managing memory described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In one embodiment, the tested circuit may include any one of the processor 405, storage 420, network interface 450, memory 410, display controller 425, memory controller 415 and I/O controller 435. The test may be a built-in self-test and may be carried out by a program stored in memory 410 or storage 420. In another embodiment, the test may be performed by an external device connected to the computer 401, such as via the network 465.

As described above, embodiments can be embodied in the form of computer-implemented processes and apparatuses for practicing those processes. An embodiment may include a computer program product on a computer readable/usable medium with computer program code logic containing instructions embodied in tangible media as an article of manufacture. Exemplary articles of manufacture for computer readable/usable medium may include floppy diskettes, CD-ROMs, hard drives, universal serial bus (USB) flash drives, or any other computer-readable storage medium, wherein, when the computer program code logic is loaded into and executed by a computer, the computer becomes an apparatus for practicing the embodiments. Embodiments include computer program code logic, for example, whether stored in a storage medium, loaded into and/or executed by a computer, or transmitted over some transmission medium, such as over electrical wiring or cabling, through fiber optics, or via electromagnetic radiation, wherein, when the computer program code logic is loaded into and executed by a computer, the computer becomes an apparatus for practicing the embodiments. When implemented on a general-purpose microprocessor, the computer program code logic segments configure the microprocessor to create specific logic circuits.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In embodiments of the disclosure, a chip test may be used to detect any stuck-at and delay faults in a chip including latches, combinational logic, registers and arrays after fabrication of the chip. The chip testing may be performed at regular intervals throughout the lifetime of the chip to detect hard errors as they develop and to identify chips that are no longer capable of running error-free within defined operating ranges or conditions.

In one embodiment, built-in self-test software and hardware may be used to perform the testing. The testing may be performed for any desired length of time and at any desired interval throughout the life of the chip. The continued testing throughout the lifetime of the chip provides for error detection of patterns that may seldom occur during normal program execution. Embodiments of the disclosure encompass performing a logic built-in self-test (LBIST), array built-in self-test (ABIST) or performing a test with an off-chip test engine.

Embodiments of the present disclosure also provide for operating a chip at a higher frequency throughout the life of the chip by determining optimal operating frequencies, not only immediately upon fabrication, but also throughout the life of the chip. For example, instead of providing a margin at fabrication to account for the likely degradation of operating frequency of the chip over its lifetime, and operating the chip outside the margin throughout its lifetime, embodiments of the present disclosure may reduce or eliminate the margin by determining optimal operating frequencies at regular intervals and operating the chip at the optimal frequency or within a predetermined range of the optimal frequency. Other examples of operating margins include operating voltage of a chip, operating temperature of the chip, data volume over time supplied to the chip, or any other condition.

Embodiments of the disclosure may be implemented to test different types of logic. For example, in the case of protected logic, error correction circuitry (ECC) or parity protection from which hard errors can be detected may be installed in all arrays, registers or latches that hold an architected state. When an ECC/parity error is detected, a data operation may be retried and an error counter may be used to determine whether the error recurs. If so, then the error may be treated as a hard error. In this embodiment, it may be unnecessary to reload stored data after a test is performed, and errors may be detected as the normal data is processed.

In embodiments of the disclosure, all of the processing cores or units of a chip may be tested in parallel. An LBIST and an ABIST may be performed for all logic and latches. If an error is detected, the LBIST or ABIST may be repeated at a different set stress condition, such as a different voltage, frequency, temperature or data volume to determine a safe level of operation. Detected errors may be reported and a new allowable or safe condition (e.g. voltage, frequency, temperature) may be reported or set. It may be determined by an operating system or other test module whether to shut down a core or chip or to adjust an internal voltage or frequency or external cooling condition or workload.

The terminology used herein is for the purpose of describing particular embodiments only and is not intended to be limiting of the invention to the particular embodiments described. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosed embodiments. Many modifications and variations will be apparent to those of ordinary skill in the art without departing from the scope and spirit of the embodiments of the present disclosure.

While preferred embodiments have been described above, it will be understood that those skilled in the art, both now and in the future, may make various improvements and enhancements which fall within the scope of the claims which follow.

What is claimed is:

1. A method of detecting multiple hard errors as they develop, the method comprising:
   at regular intervals that correspond to and extend throughout a lifetime of a circuit, halting a flow of normal data through the circuit;
   running test data through the circuit while subjecting the circuit to a stress condition to detect the multiple hard errors as they develop and prior to the multiple hard errors being established in order to identify a chip that is no longer capable of running error-free within defined operating conditions;
   wherein halting the flow of normal data through the circuit includes stopping the flow of the normal data into normal data inputs of at least one set of input latches and storing the normal data from the at least one set of input latches and at least one set of output latches in a storage prior to running the test data through the circuit; and
   restoring the normal data to the at least one set of input latches and the at least one set of output latches based on determining that a number of the multiple hard errors in the circuit is less than a predetermined threshold.

2. The method of claim 1, wherein the circuit includes combinational logic in series with the at least one set of input latches and the at least one set of output latches.

3. The method of claim 2, wherein both of the normal data and the test data are input through normal data inputs of the at least one set of input latches and read out from normal data outputs of the at least one set of output latches.

4. The method of claim 1, wherein subjecting the circuit to the stress condition includes running the test data through the circuit in a same environment as the circuit operates normally.

5. The method of claim 1, wherein subjecting the circuit to the stress condition includes simulating conditions in an environment in which the circuit operates normally.

6. The method of claim 1, wherein the stress condition includes at least one of an operating frequency of the circuit, an operating voltage of the circuit, a temperature of the circuit, and a data density provided to the circuit.

7. The method of claim 1, wherein running the test data through the circuit includes performing a built-in self-test (BIST) of the circuit.

* * * * *